US009991101B2

(12) United States Patent
Johanson et al.

(10) Patent No.: US 9,991,101 B2
(45) Date of Patent: Jun. 5, 2018

(54) MAGNETRON ASSEMBLY FOR PHYSICAL VAPOR DEPOSITION CHAMBER

(71) Applicant: APPLIED MATERIALS, INC., Santa Clara, CA (US)

(72) Inventors: William Johanson, Gilroy, CA (US); Brij Datta, Cupertino, CA (US); Fuhong Zhang, Cupertino, CA (US); Adolph Miller Allen, Oakland, CA (US); Yu Y. Liu, San Jose, CA (US); Prashanth Kothnur, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 343 days.

(21) Appl. No.: 14/725,527

(22) Filed: May 29, 2015

(65) Prior Publication Data
US 2016/0035547 A1 Feb. 4, 2016

Related U.S. Application Data

(60) Provisional application No. 62/030,295, filed on Jul. 29, 2014.

(51) Int. Cl.
*C23C 14/34* (2006.01)
*H01J 37/34* (2006.01)
*C23C 14/35* (2006.01)

(52) U.S. Cl.
CPC .......... *H01J 37/3405* (2013.01); *C23C 14/35* (2013.01); *H01J 37/3452* (2013.01); *H01J 37/3455* (2013.01); *H01J 37/3461* (2013.01)

(58) Field of Classification Search
CPC .......................... H01J 37/3452; H01J 37/3455
See application file for complete search history.

(56) References Cited

U.S. PATENT DOCUMENTS

| 6,432,285 | B1* | 8/2002 | Kastanis | H01J 37/3408 |
| | | | | 204/298.16 |
| 7,179,351 | B1* | 2/2007 | Juliano | H01J 37/3408 |
| | | | | 204/192.12 |
| 7,569,123 | B1* | 8/2009 | Juliano | C23C 14/35 |
| | | | | 204/192.13 |
| 2007/0108041 | A1 | 5/2007 | Guo | |
| 2009/0218218 | A1* | 9/2009 | Kutsuzawa | C23C 14/35 |
| | | | | 204/298.16 |

(Continued)

OTHER PUBLICATIONS

U.S. Appl. No. 12/754,743, filed Apr. 5, 2010, Allen et al.
International Search Report and Written Opinion dated Aug. 28, 2015 for PCT Application No. PCT/US2015/033324.

*Primary Examiner* — Jason Berman
(74) *Attorney, Agent, or Firm* — Moser Taboada; Alan Taboada

(57) ABSTRACT

Methods and apparatus for a magnetron assembly are provided herein. In some embodiments, a magnetron assembly includes a shunt plate having a central axis and rotatable about the central axis, a closed loop magnetic pole coupled to a first surface of the shunt plate and disposed 360 degrees along a peripheral edge of the shunt plate, and an open loop magnetic pole coupled at a the first surface of the shunt plate wherein the open loop magnetic pole comprises two rows of magnets disposed about the central axis.

20 Claims, 4 Drawing Sheets

(56) References Cited

U.S. PATENT DOCUMENTS

2011/0311735 A1* 12/2011 Wang ..................... C23C 14/35
                                                              427/571
2012/0027954 A1    2/2012  Liu et al.
2014/0042023 A1    2/2014  Ritchie et al.

* cited by examiner

MAGNETRON ASSEMBLY FOR PHYSICAL VAPOR DEPOSITION CHAMBER

CROSS-REFERENCE TO RELATED APPLICATIONS

This application claims benefit of U.S. provisional patent application Ser. No. 62/030,295, filed Jul. 29, 2014, which is herein incorporated by reference.

FIELD

Embodiments of the present disclosure generally relate to magnetrons for use in physical vapor deposition chambers for substrate processing.

BACKGROUND

Sputtering, alternatively called physical vapor deposition (PVD), has long been used in depositing metals and related materials in the fabrication of semiconductor integrated circuits. Its use has been extended to depositing metal layers onto the sidewalls of high aspect-ratio holes such as vias or other vertical interconnect structures. Currently, advanced sputtering applications include depositing a metallic seed layer for later electroplating of the metallic layer in the via and depositing a barrier layer on the dielectric material of the via sidewall to prevent the metallic layer from diffusing into the dielectric.

Plasma sputtering may be accomplished using either DC sputtering or RF sputtering. Plasma sputtering typically includes a magnetron positioned at the back of the sputtering target to project a magnetic field into the processing space to increase the density of the plasma and enhance the sputtering rate. The inventors have observed that as the distance between the substrate and the sputtering target is increased, the plasma density and volume can be increased to advantageously improve overall bottom coverage on the substrate. However, because of the ion density and diffusion of the ions in the plasma, as the distance between the substrate and the sputtering target is increased, the more difficult it becomes to meet the uniformity and particle performance since the magnetron influence decreases.

Thus, the inventors have provided a magnet configuration that can advantageously be used to deposit materials while improving particle performance.

SUMMARY

Methods and apparatus for a magnetron assembly are provided herein. In some embodiments, a magnetron assembly includes a shunt plate having a central axis and rotatable about the central axis, a closed loop magnetic pole coupled to a first surface of the shunt plate and disposed 360 degrees along a peripheral edge of the shunt plate, and an open loop magnetic pole coupled at a the first surface of the shunt plate wherein the open loop magnetic pole comprises two rows of magnets disposed about the central axis.

In some embodiments, a method of processing a substrate in a physical vapor deposition (PVD) chamber includes applying a first RF power at a first frequency to a target comprising a metal disposed above the substrate to form a plasma from a plasma-forming gas, applying DC power to the target to direct the plasma towards the target, rotating a magnetron above the target while directing the plasma towards the target, the magnetron having (a) a closed loop magnetic pole coupled to a first surface of a shunt plate and disposed 360 degrees along a peripheral edge of the shunt plate, and (b) an open loop magnetic pole coupled at a the first surface of the shunt plate wherein the open loop magnetic pole comprises two rows of magnets disposed about the central axis, sputtering metal atoms from the target using the plasma in the PVD chamber sufficient to ionize a predominant portion of the metal atoms sputtered from the target, and depositing the ionized metal atoms on the substrate to form a layer thereon.

In some embodiments, a substrate processing system includes a chamber, a lid removably disposed atop the chamber, a target assembly coupled to the lid, the target assembly including a target material to be sputtered from the target and deposited on a substrate, a substrate support disposed within the chamber for supporting a substrate during processing, and a magnetron assembly including a shunt plate having a central axis and rotatable about the central axis, a closed loop magnetic pole coupled to a first surface of the shunt plate and disposed 360 degrees along a peripheral edge of the shunt plate and an open loop magnetic pole coupled at a the first surface of the shunt plate wherein the open loop magnetic pole comprises two rows of magnets disposed about the central axis.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
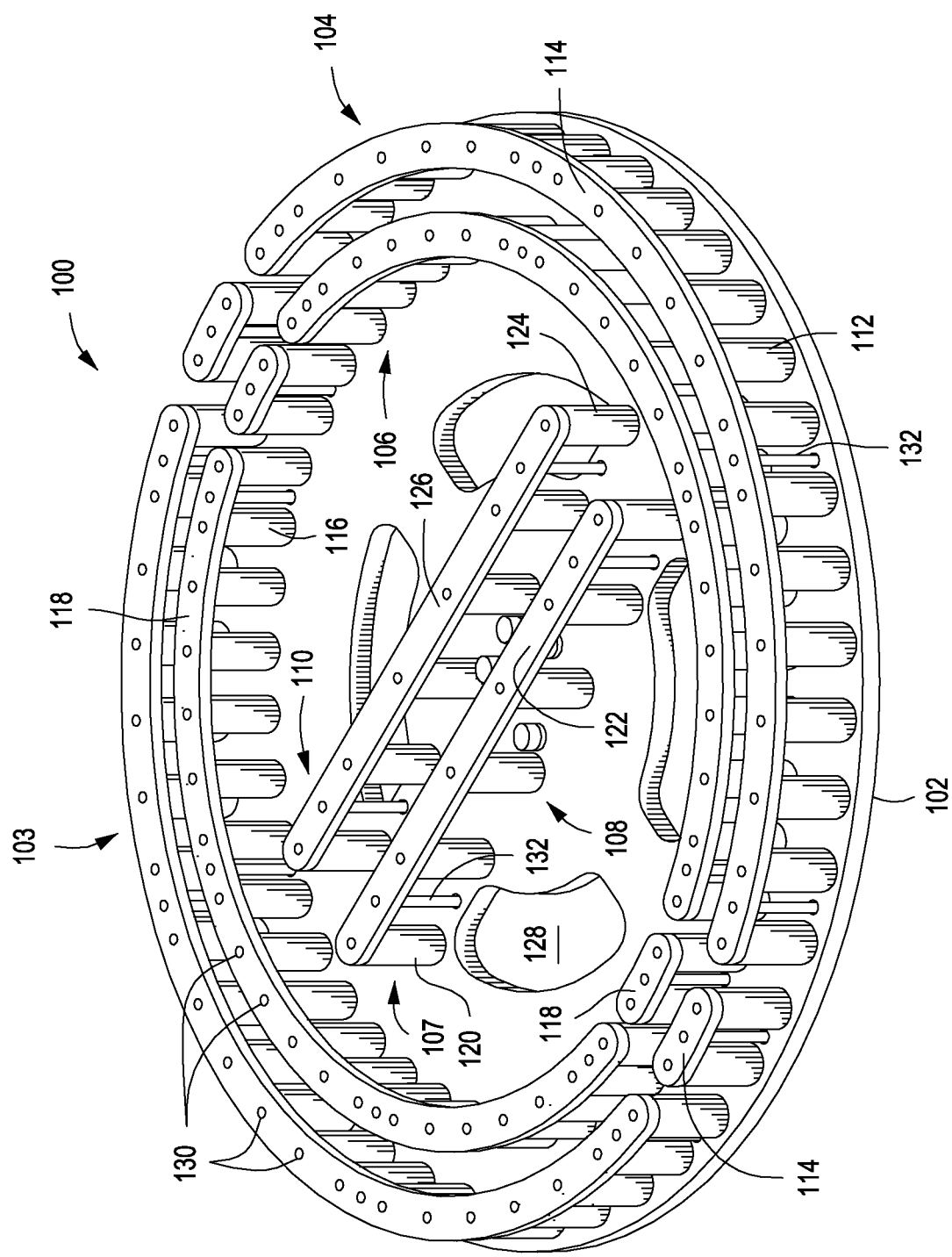
FIG. 1 depicts an isometric view of a rotatable magnet assembly in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure relate to magnetron designs for use in radio frequency (RF) physical vapor deposition (PVD) processes. Embodiments of the inventive magnetron may advantageously increase target life, improve deposition uniformity, and provide step coverage for processes performed in an RF/DC PVD chamber. More specifically, exemplary embodiments of the present disclosure advantageously improve material deposition uniformity at increased distances between the sputtering target and substrate deposition surface.

The magnetrons of the present disclosure may generally be used in PVD chambers having RF and DC power applied to the target of the PVD chamber. Non-limiting examples of processes that may benefit from utilization of the present inventive magnetron include deposition processes including copper, titanium nitride, nickel platinum, cobalt, titanium, and tantalum deposition, amongst other deposition processes.

Some exemplary embodiments of the present disclosure include placement of magnet pairs at the periphery and in the center and middle areas of a rotatable magnetron to address uniformity and particle problems observed at target to substrate distances >95 mm (e.g., 145 mm). The periphery portion of the magnet forms a nearly closed loop magnetic tracks with large magnetic strength about the circumference of the magnetron. In some embodiments, the center portion of the magnetron includes two linear loop magnetic tracks to help reduce center deposition. The inventive magnetrons described herein may be sized and used for processing 200 mm, 300 mm or 450 mm substrates.

Figure 2A:
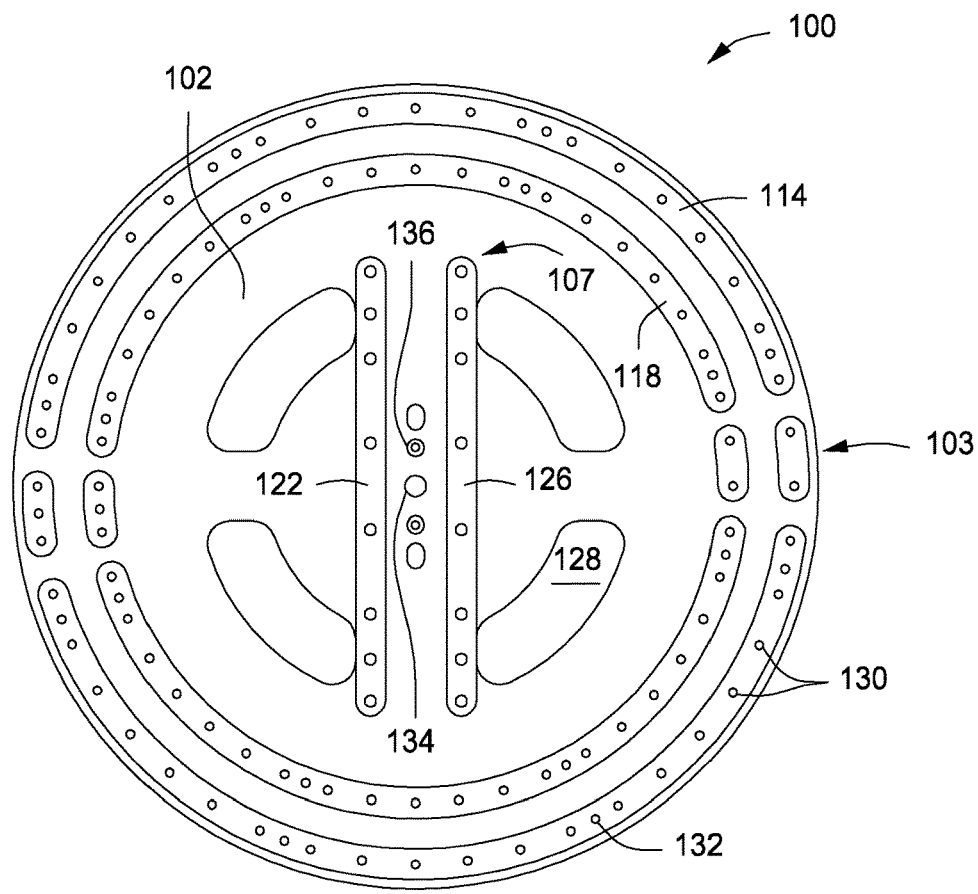
FIGS. 2A-B respectively depict bottom, and side views of a rotatable magnet assembly in accordance with some embodiments of the present disclosure.
Figure 2B:
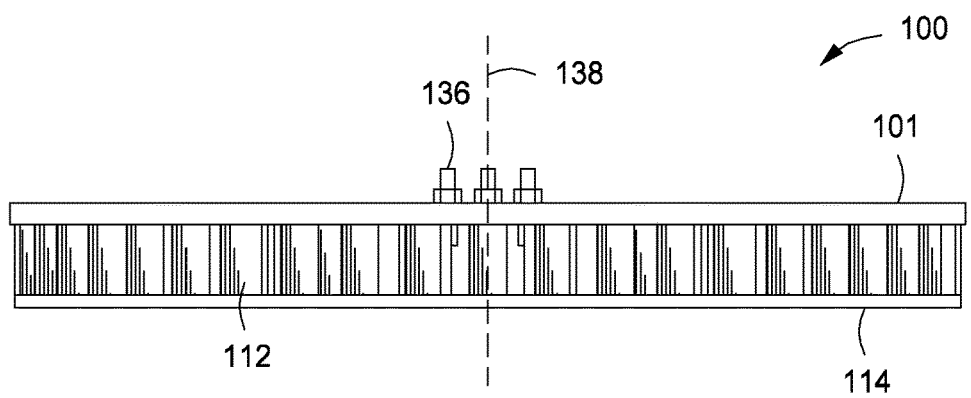
Figure 3:
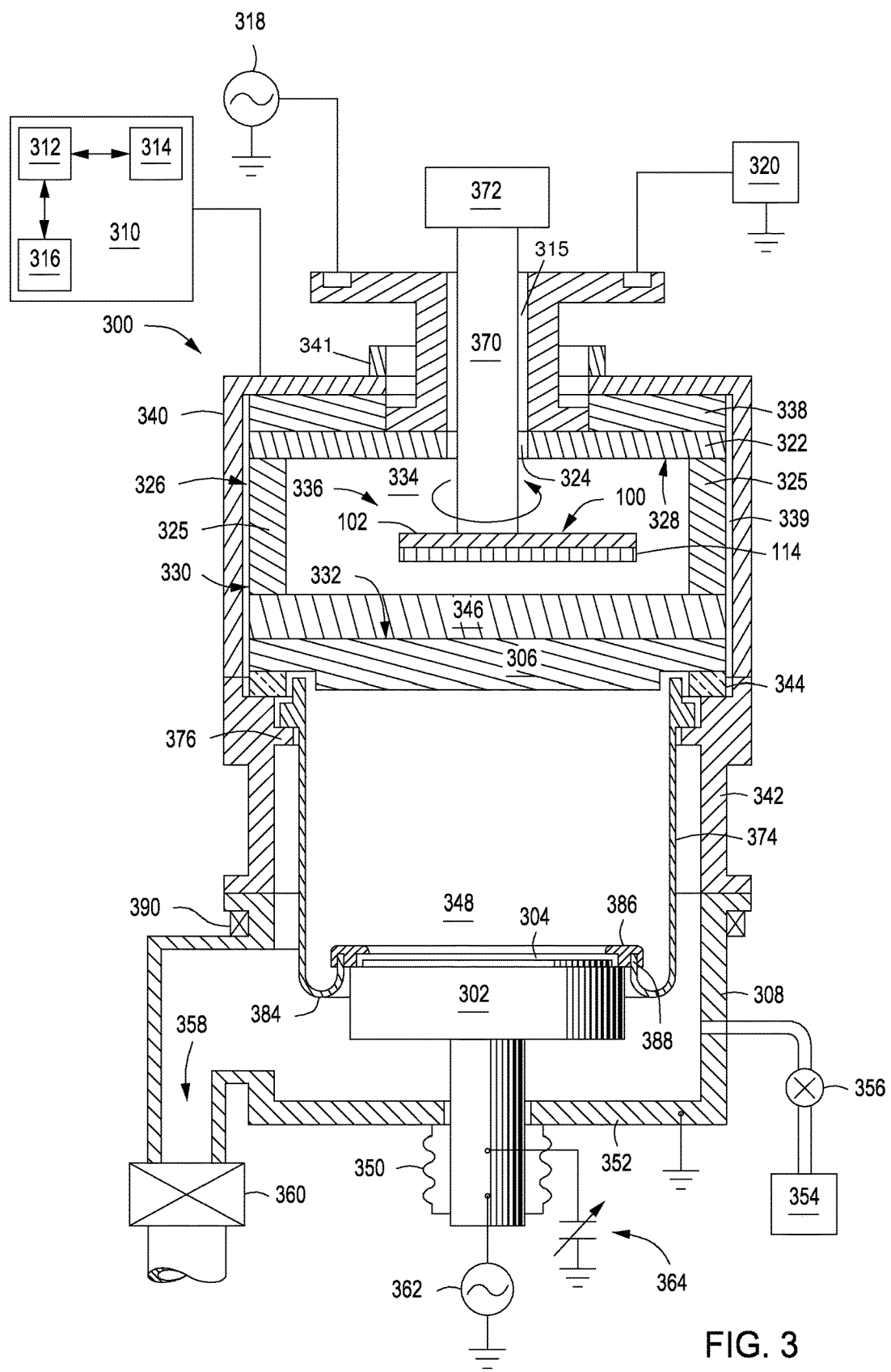
FIG. 3 depicts a schematic cross sectional view of a process chamber in accordance with some embodiments of the present disclosure.

For example, FIGS. 1, 2A and 2B depict an isometric, bottom and side perspective views, respectfully, of a magnetron 100 in accordance with some embodiments of the present disclosure. The magnetron 100 includes a shunt plate 102 which also serves as a structural base for the magnetron assembly. In some embodiments, the shunt plate 102 may have one or more cutouts 128 to reduce weight and material costs. The shunt plate 102 may include a central opening 134 and mounting bracket 136, or other fastener, for mounting the shunt plate to a shaft to provide rotation of the magnetron 100 during use (for example, such as a rotation shaft 370 as shown in FIG. 3 and discussed below). A closed loop magnetic pole 103, formed by include two rings of magnets 104, 106, is coupled to the shunt plate. In addition, two central rows of magnets 108, 110 forming open loop magnetic pole 107 is also coupled to the shunt plate. As described and used herein, an open loop magnetic pole is a magnet pairing that is open ended so as not to confine electrons for the power applied. The poles 103, 107 may be coupled to the shunt plate, for example via a plurality of socket head cap screws 130 or other type of fastener. In some embodiments, the two rings of magnets 104, 106 are concentric to each other as depicted in the figures and described below. However, in alternate embodiments, the two rings of magnets 104, 106 may not be concentric and each ring may have different spacing between magnets and varying radius.

Each of the inventive magnetron designs discussed herein include two rings of magnets 104, 106 that are spaced apart from each other to form the substantially closed loop magnetic pole 103 about the circumference of the magnetron. Each ring of magnets 104, 106 is axisymmetrically disposed about central axis 138 of shunt plate 102. Each ring of magnets 104, 106 may comprise a plurality of magnets 112, 116 arranged to form a concentric ring. The magnets 112, 116 may be provided in size and number to provide a particular strength magnetic field. Respective pole pieces 114, 118 may be disposed over each of the pluralities of magnets 112, 116 to provide a continuous concentric ring shape. The pole pieces 114, 118 may be fabricated from a ferromagnetic material, such as for example, 400-series stainless steel, 316 stainless steel, titanium or other suitable materials. In some embodiments, pole pieces 114, 118 may be non-magnetic which can provide additional/alternate tuning capabilities. In some embodiments, each concentric ring may be segmented into a plurality of smaller arc segments to form the ring. In some embodiments, the segments in each concentric ring may be differently sized. Additional supports 132 may fasten the pole pieces 114, 118 to the shunt plate 102.

The distance between the two concentric rings may be constant. In some embodiments, the distance between the concentric rings may range from about 0.5 to about 4 inches. In some embodiments, for example, in a magnetron designed for 300 mm substrate processing, the inner of the two concentric rings may be disposed from about 4 inches to about 8 inches from a center of rotation of the magnetron. The magnetic strength of the two rings of magnets 104, 106 may be the same or different. The polarity within a given ring of magnets 104, 106 may be the same (e.g., north or south), but the polarity between the two rings of magnets 104, 106 should be opposite (e.g., outer ring north and inner south or outer ring south and inner ring north) as shown in FIG. 1. Since the field strength is from north to south, the two rings of magnets 104, 106 for the closed loop magnetic pole 103 that is disposed 360 degrees about the peripheral edge of the shunt plate 102.

Each of the inventive magnetron designs discussed herein also include a central open loop magnetic pole 107 formed by rows of magnets 108, 110 that are coupled to the shunt plate 102. The two rows of magnets 108, 110 are spaced apart from each other. In some embodiments, the two rows of magnets 108, 110 may be linear rows or may be non-linear rows. In some embodiments, the two rows of magnets 108, 110 are disposed equidistantly from the central axis 138 of the shunt plate 102. In some embodiments, the two rows of magnets 108, 110 are parallel to each other. In some embodiments, the two rows of magnets 108, 110 are spaced apart from about 0.5 inches to about 4 inches. Each row of magnets 108, 110 may comprise a plurality of magnets 120, 124 arranged to form the rows. The magnets 120, 124 may be provided in size and number to provide a particular strength magnetic field. Respective pole pieces 122, 126 may be disposed over each of the pluralities of magnets 120, 124 to provide a continuous linear shape. The pole pieces 122, 126 may be fabricated from a ferromagnetic material, such as in a non-limiting example, 400-series stainless steel or other suitable materials. In some embodiments, each open loop magnetic poles 107 may be segmented into a plurality of smaller linear segments to form the central open loop magnetic pole 107. In some embodiments, the linear segments in each linear open loop magnetic poles may be differently sized. Additional supports 132 may fasten the pole pieces 122, 126 to the shunt plate 102.

The polarity within a given linear row of magnets 108, 110 may be the same (e.g., north or south), but the polarity between the two rows of magnets 108, 110 should be opposite (e.g., linear row of magnets 108 north and linear row of magnets 110 south or vice versa) as shown in FIG. 1.

In both the closed loop magnetic pole 103 and the open loop magnetic pole 107, the plurality of magnets 112, 116, 120, 124 need not span the entire length of the respective linear pole pieces 114, 118, 122, 126 and may be distributed in any suitable arrangement to adjust overall magnetic field strength and/or magnetic field shape of the magnetron 100.

As used herein, a "closed loop magnetic pole" is a closed magnetic path that constrains the electrons within the loop. An "open loop magnetic pole" is an open magnetic path such that electrons enter on one end and exit from an opposite end (i.e., the electrons are not constrained within the loop).

The embodiments discussed above in FIGS. 1, 2A and 2B may provide one or more benefits. In some embodiments, the inventive magnetrons described herein can reduce the size of particles deposited on the substrate surface to less than 2 adders at 90 nm, and less than 10 adders at 70 nm. In some embodiments, the inventive magnetrons described herein can produce particle sizes on the average of 1.7 adders at 90 nm.

In addition, the inventive magnetrons described herein prevent or substantially reduce re-deposition by providing a strong magnetic field along the edges along (via the closed loop magnetic pole 103) while also providing a lower strength magnetic field along the center (via the open loop magnetic pole 107). Specifically, re-deposition of particles at the center of the target occurs if not enough magnetic field strength is provided at the center of the target. The re-deposited particles arrive at the target surface at relatively low energy and then accumulate in such a way that there may be an interface between the original free target material surface (e.g., the original free Cu surface) and the re-deposited material. The inventors have observed that the re-deposited particles at the interface are susceptible to delamination from the original target surface, particularly at higher pressure deposition processes. Thus, center magnets are included in magnetrons to increase magnetic field strength at the center of the target/substrate and to prevent re-deposition. However, the inventors have observed that if too many magnets are included in the center, the deposition on the substrate is too thick in the center of the substrate. Furthermore, in deposition processes run at higher pressures (e.g., 80-100 mT, whereas typical PVD processes operate at 1-5 mT or less), more diffusion of the metal flux between the target and the substrate is observed. However, since the center magnets help prevent particle re-deposition, more magnets are added at the periphery of the magnetron to compensate for magnetic field generated by the center magnets. In addition, instead of adding a closed loop magnetic array in the center, an open loop array is added to minimally confine the DC portion of the plasma.

FIG. 3 depicts a schematic, cross-sectional view of a physical vapor deposition chamber (process chamber 300) in accordance with some embodiments of the present disclosure. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive apparatus disclosed herein.

The process chamber 300 contains a substrate support pedestal 302 for receiving a substrate 304 thereon, and a sputtering source, such as a target 306. The substrate support pedestal 302 may be located within a grounded chamber wall 308, which may be a chamber wall (as shown) or a grounded shield (a ground shield 340 is shown covering at least some portions of the chamber 300 above the target 306. In some embodiments, the ground shield 340 could be extended below the target to enclose the pedestal 302 as well.).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320. In some embodiments, about 6 kW of 40 MHz RF is provided at the same time about 1 kW of DC power is provided to produce the desired particle properties. In some embodiments, the RF power is provided at about 4 kW to about 8 Kw at a frequency of about 13.56 MHz to about 60 MHz, and the DC power simultaneously at about 0.5 kW to about 2 kW.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure). The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 325 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar 341 may be disposed about the body and lower portion of the feed structure. The ground collar 341 is coupled to the ground shield 340 and may be an integral part of the ground shield 340 or a separate part coupled to the ground shield to provide grounding of the feed structure. The ground collar 341 may be made from a suitable conductive material, such as aluminum or copper. In some embodiments, a gap disposed between the inner diameter of the ground collar 341 and the outer diameter of the body of the feed structure may be kept to a minimum and be just enough to provide electrical isolation. The gap can be filled with isolating material like plastic or ceramic or can be an air gap. The ground collar 341 prevents cross-talk between the RF feed (e.g., electrical feed 205, discussed below) and the body, thus improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a gas source 354 through a mass flow controller 356 into the lower part of the chamber 300. An exhaust port 358 may be provided and coupled to a pump (not shown) via a valve 360 for exhausting the interior of the process chamber 300 and facilitating maintaining a pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Optionally, a second RF bias power source (not shown) may be coupled to the substrate support pedestal 302 and provide any of the frequencies discussed above for use with the RF bias power source 362. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired. In some embodiments, the capacitance tuner 364 may be used to adjust the substrate floating potential so that ion energy arriving at the substrate can be controlled.

A rotatable magnetron assembly 336 may be positioned proximate a back surface (e.g., source distribution plate-facing surface 332) of the target 306. The rotatable magnetron assembly 336 includes the magnetron 100 which connects to a rotation shaft 370 coincident with the central axis of the chamber 300 and the substrate 304. For example, the magnetron 100 may be coupled to the rotation shaft 370 at the central opening 134 via the mounting bracket 136. A motor 372 can be coupled to the upper end of the rotation shaft 370 to drive rotation of the magnetron assembly 336. The magnets 112, 116, 120, 124 produce a magnetic field within the chamber 300, generally parallel and close to the surface of the target 306 to trap electrons and increase the local plasma density, which in turn increases the sputtering rate. The magnets 112, 116, 120, 124 produce an electromagnetic field around the top of the chamber 300, and the magnets are rotated to rotate the electromagnetic field which influences the plasma density of the process to more uniformly sputter the target 306. For example, the rotation shaft 370 may make about 0 to about 150 rotations per minute. Embodiments of the magnetron 100 illustrated in FIGS. 1, 2A and 2B are shown in combination with the chamber 300, however, any embodiments of a magnetron disclosed herein may be utilized in combination with the chamber 300 and the methods described below for processing the substrate 304.

In some embodiments, the chamber 300 may further include a process kit shield 374 connected to a ledge 376 of the adapter 342. The adapter 342 in turn is sealed and grounded to the aluminum chamber wall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in a lower, loading position but rests on the outer periphery of the substrate support pedestal 302 when the cover ring 386 is in an upper, deposition position to protect the substrate support pedestal 302 from sputter deposition. An additional deposition ring (not shown) may be used to shield the periphery of the substrate 304 from deposition.

In some embodiments, a magnet 390 may be disposed about the chamber 300 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 314 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

In operation, a method for processing the substrate 304 may include applying a first RF power (for example, from the RF power source 318) at a VHF frequency to the target 306 comprising a metal disposed above the substrate to form a plasma from a plasma-forming gas. For example, the plasma-forming gas may be provided by the gas source 354. DC power, for example from the DC power source 320, can be applied to the target 306 to direct the plasma towards the target 306. While directing the plasma towards the target 306, the magnetron 100 may be rotated to provide benefits as discussed above, such as improved deposition uniformity and/or target lifetime and the like. Metal atoms from the target 306 are sputtered using the plasma while maintaining a first pressure in the chamber 300 sufficient to ionize a predominant portion of the metal atoms sputtered from the target 306. For example, the first pressure may be adequate to ensure that a substantial portion of the metal atoms sputtered from the target 306 interact with the plasma disposed between the target 306 and the substrate 304 such that the sputtered metal atoms become ionized. The ionized metal atoms can be deposited on the substrate 304 to form a layer thereon. For example, some embodiments of a layer may include depositing a layer in a high aspect ratio opening disposed in the substrate 304. For example, high aspect ratios may include a height:width of the opening ranging from about 5:1 to about 15:1, or greater than about 15:1. In some embodiments, a second RF power (for example, from the RF bias power source 362) may be applied to the substrate 304 at least one of during or after depositing the ionized metal atoms on the substrate 304 to form the layer. For example, the second RF power may be utilized to direct ionized metal atoms towards a bottom surface of the opening and/or re-sputter deposited metal atoms to more completely for a layer on the surfaces of the opening.

Further, a plurality of substrates may be sequentially provided to the chamber 300 to form a layer on each substrate by the method described above. For example, the plurality of substrates may all be processed using the same target 306. The inventive design of the magnetron 100 may facilitate a sputtering distribution of metal atoms from the target 306 such that an initial profile of an initial layer formed on an initial substrate in the plurality of substrates is substantially equivalent to a final profile of a final layer formed on a final substrate in the plurality of substrates to be processed in the PVD chamber. Accordingly, the inventive magnetron 100 may allow for improved target wear such that the quality of each layer formed on each sequentially processed substrate is substantially similar. In some embodiments, the number of substrates in the plurality which may be processed prior to having to replace the target may range from about 5,000 to about 100,000 depending on thickness of layers being formed, and other factors which may accelerate target replacement.

Figure 4:
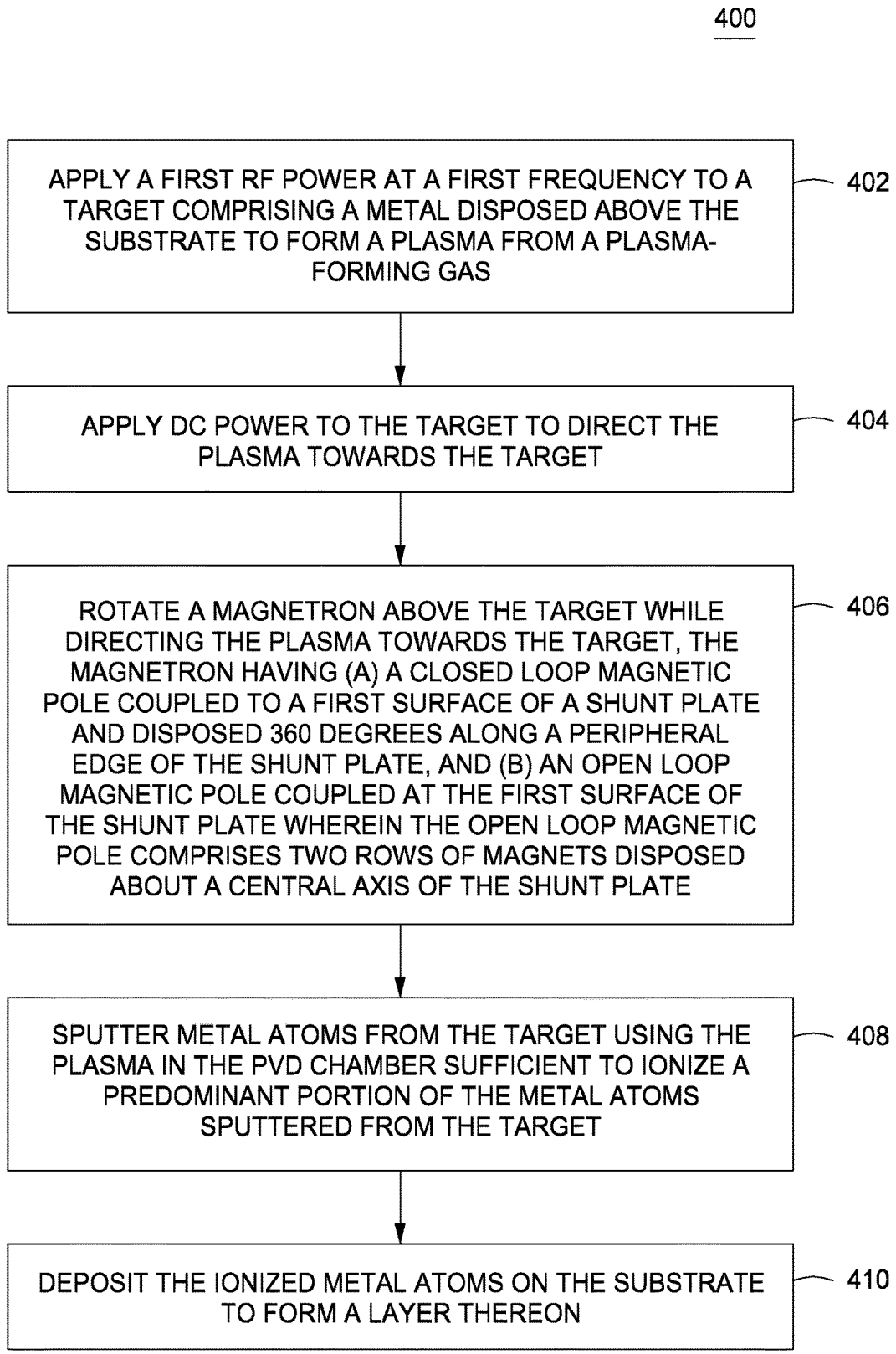
FIG. 4 is a method for processing a substrate in accordance with some embodiments of the present disclosure.

FIG. 4 is a method 400 for processing a substrate in a physical vapor deposition (PVD) chamber in accordance with some embodiments of the present disclosure. The method 400 may be performed by controller 310. The method 400 begins at 402 where a first RF power is applied at a first frequency to a target comprising a metal disposed above the substrate to form a plasma from a plasma-forming gas. At 404, a DC power is applied to the target to direct the plasma towards the target. A magnetron is rotated above the target while directing the plasma towards the target at 406. In some embodiments, the magnetron may include (a) a closed loop magnetic pole coupled to a first surface of a shunt plate and disposed 360 degrees along a peripheral edge of the shunt plate, and (b) an open loop magnetic pole coupled at a the first surface of the shunt plate. The open loop magnetic pole may include two rows of magnets disposed about a central axis of the shunt plate. At 408, metal atoms from the target are sputtered using the plasma in the PVD chamber sufficient to ionize a predominant portion of the metal atoms sputtered from the target. Finally, at 410 the ionized metal atoms are deposited on the substrate to form a layer thereon.

Thus, methods and apparatus to improve target life and deposition uniformity in PVD chambers are provided herein. The inventive magnetron may advantageously increase target life, improve deposition uniformity, and provide step coverage in an RF/DC PVD chamber.

While the foregoing is directed to embodiments of the present disclosure, other and further embodiments of the disclosure may be devised without departing from the basic scope thereof.

The invention claimed is:

1. A magnetron assembly, comprising:
   a shunt plate having a central axis and rotatable about the central axis;
   a closed loop magnetic pole coupled to a first surface of the shunt plate and disposed 360 degrees along a peripheral edge of the shunt plate; and
   an open loop magnetic pole coupled at a the first surface of the shunt plate wherein the open loop magnetic pole comprises a first linear row of magnets disposed on one side of the central axis, and a second linear row of magnets that is parallel to the first linear row of magnets and disposed on a second opposing side of the central axis, and wherein the first and second linear rows of magnets are disposed equidistantly from the central axis.

2. The magnetron assembly of claim 1, wherein a first polarity of the first linear row of magnets opposes a second polarity of the second linear row of magnets.

3. The magnetron assembly of claim 1, wherein each of the first linear row and the second linear row of magnets includes a pole piece and a plurality of magnets disposed between the pole piece and the shunt plate.

4. The magnetron assembly of claim 1, wherein a distance between the first linear row and the second linear row of magnets is about 0.5 inches to about 2 inches.

5. The magnetron assembly of claim 1, wherein the closed loop magnetic pole is formed by an inner concentric ring of magnets and an outer concentric ring of magnets.

6. The magnetron assembly of claim 5, wherein a first polarity of the inner concentric ring of magnets opposes a second polarity of the outer concentric ring of magnets.

7. The magnetron assembly of claim 5, wherein each of the inner concentric ring of magnets and the outer concentric ring of magnets is disposed axisymmetric about the central axis of the shunt plate.

8. The magnetron assembly of claim 5, wherein the inner concentric ring of magnets includes a first pole piece and a plurality of first magnets disposed between the first pole piece and the shunt plate, and wherein the outer concentric ring of magnets includes a second pole piece and a plurality of second magnets disposed between the second pole piece and the shunt plate.

9. The magnetron assembly of claim 8, wherein each of the plurality of first magnets and the plurality of second magnets are coupled to the shunt plate via a plurality of socket head cap screws.

10. The magnetron assembly of claim 5, wherein at least one of the inner concentric ring of magnets or the outer concentric ring of magnets further comprises a plurality of magnetic pole arc segments that form the concentric rings.

11. The magnetron assembly of claim 5, wherein a distance between the inner concentric ring of magnets and the outer concentric ring of magnets is about 0.5 inches to about 2 inches.

12. The magnetron assembly of claim 1, wherein the shunt plate includes one or more cutouts.

13. The magnetron assembly of claim 1, wherein the shunt plate includes a central opening and a mounting portion that coupes the magnetron assembly to a shaft to provide rotation of the magnetron assembly.

14. A method of processing a substrate in a physical vapor deposition (PVD) chamber, comprising:
   applying a first RF power at a first frequency to a target comprising a metal disposed above the substrate to form a plasma from a plasma-forming gas;
   applying DC power to the target to direct the plasma towards the target;
   rotating a magnetron above the target while directing the plasma towards the target, the magnetron having (a) a closed loop magnetic pole coupled to a first surface of a shunt plate and disposed 360 degrees along a peripheral edge of the shunt plate, and (b) an open loop magnetic pole coupled at a the first surface of the shunt plate wherein the open loop magnetic pole comprises a first linear row of magnets disposed on one side of a central axis of the shunt plate, and a second linear row of magnets that is parallel to the first linear row of magnets and disposed on a second opposing side of the central axis, and wherein the first and second linear rows of magnets are disposed equidistantly from the central axis;
   sputtering metal atoms from the target using the plasma in the PVD chamber sufficient to ionize a predominant portion of the metal atoms sputtered from the target; and
   depositing the ionized metal atoms on the substrate to form a layer thereon.

15. The method of claim 14, wherein the RF power is provided at about 4 kW to about 8 Kw at a frequency of about 13.56 MHz to about 60 MHz, and wherein the DC power is provided simultaneously with the RF power at about 0.5 kW to about 2 kW.

16. The method of claim 14, wherein the RF power is provided at about 6 kW at 40 MHz, and wherein the DC power is provided simultaneously with the RF power at about 1 kW.

17. A substrate processing system, comprising:
   a chamber;
   a lid removably disposed atop the chamber;
   a target assembly coupled to the lid, the target assembly including a target material to be sputtered from the target and deposited on a substrate;
   a substrate support disposed within the chamber for supporting a substrate during processing; and
   a magnetron assembly, comprising:
      a shunt plate having a central axis and rotatable about the central axis;
      a closed loop magnetic pole coupled to a first surface of the shunt plate and disposed 360 degrees along a peripheral edge of the shunt plate; and
      an open loop magnetic pole coupled at a the first surface of the shunt plate wherein the open loop magnetic pole comprises a first linear row of magnets disposed on one side of the central axis, and a second linear row of magnets that is parallel to the first linear row of magnets and disposed on a second opposing side of the central axis, and wherein the first and second linear rows of magnets are disposed equidistantly from the central axis.

18. The substrate processing system of claim 17, wherein a first polarity of the first linear row of magnets opposes a second polarity of the second linear row of magnets.

19. The substrate processing system of claim 17, wherein the closed loop magnetic pole is formed by an inner concentric ring of magnets and an outer concentric ring of magnets, and wherein a first polarity of the inner concentric ring of magnets opposes a second polarity of the outer concentric ring of magnets.

20. The substrate processing system of claim 17, further comprising:
   a DC power source coupled to the target assembly; and
   an RF power source coupled to the target assembly.

* * * * *